United States Patent

Kataoka et al.

[11] Patent Number: 6,001,488
[45] Date of Patent: Dec. 14, 1999

[54] COMPOSITION OF EPOXY GROUP-CONTAINING CYCLOOLEFIN RESIN

[75] Inventors: Hideaki Kataoka; Eiko Yuda, both of Kanagawa; Shigemitsu Kamiya, Tokyo; Masahide Yamamoto, Kanagawa; Yoshikatsu Ishizuki, Kanagawa; Yasuhiro Yoneda, Kanagawa; Daisuke Mizutani, Kanagawa; Kishio Yokouchi, Kanagawa, all of Japan

[73] Assignees: Nippon Zeon Co., Ltd., Tokyo; Fujitsu Limited, Kanagawa, both of Japan

[21] Appl. No.: 09/106,179

[22] Filed: Jun. 29, 1998

Related U.S. Application Data

[62] Division of application No. 08/781,385, Jan. 13, 1997, Pat. No. 5,783,639, which is a continuation of application No. 08/404,823, Mar. 14, 1995, abandoned.

[30] Foreign Application Priority Data

| Mar. 14, 1994 | [JP] | Japan | 6-69124 |
| Mar. 14, 1994 | [JP] | Japan | 6-69125 |
| Jul. 14, 1994 | [JP] | Japan | 6-185415 |
| Jan. 25, 1995 | [JP] | Japan | 7-28766 |

[51] Int. Cl.$^6$ ............ B32B 27/04; B32B 27/28; C08F 255/08; C08L 51/06
[52] U.S. Cl. ............ 428/447; 428/901; 522/65; 522/68; 522/149; 525/286; 525/332.1
[58] Field of Search ................ 522/65, 68, 149; 525/286, 332.1; 428/447, 901

[56] References Cited

U.S. PATENT DOCUMENTS

| 4,131,653 | 12/1978 | Hsieh et al. . | |
| 5,179,171 | 1/1993 | Minami et al. | 525/288 |
| 5,342,885 | 8/1994 | St. Clair | 525/65 |

FOREIGN PATENT DOCUMENTS

| 0 397 195 | 11/1990 | European Pat. Off. . |
| 50-72702 | 6/1975 | Japan . |
| 61-227204 | 10/1986 | Japan . |
| 62-34924 | 2/1987 | Japan . |
| 2-227424 | 9/1990 | Japan . |
| 2-276842 | 11/1990 | Japan . |
| 3-14882 | 1/1991 | Japan . |
| 3-122137 | 5/1991 | Japan . |
| 1110095 | 4/1968 | United Kingdom . |

Primary Examiner—Robert E. Sellers
Attorney, Agent, or Firm—McDermott, Will & Emery

[57] ABSTRACT

A resin composition comprising an epoxy group-containing cycloolefin resin and a crosslinking agent is provided. More specifically, a resin composition comprising an epoxy group-containing thermoplastic norbornene resin obtained by introducing epoxy groups into a thermoplastic norbornene resin, and as the crosslinking agent, a curing agent for epoxy resins or a photoreactive substance is provided. The resin composition is suitable for use as an insulating material.

4 Claims, No Drawings

6,001,488

COMPOSITION OF EPOXY GROUP-CONTAINING CYCLOOLEFIN RESIN

This application is a division of application Ser. No. 08/781,385 filed Jan. 13, 1997, U.S. Pat. No. 5,783,639 which is a continuation of application Ser. No. 08/404,823 filed Mar. 14, 1995, abandoned.

FIELD OF THE INVENTION

The present invention relates to a composition of an epoxy group-containing cycloolefin resin with an crosslinking agent, and more particularly to an epoxy group-containing cycloolefin resin composition excellent in heat resistance, solvent resistance, low water-absorption property, electrical insulating property, adhesion, chemical resistance and the like.

The cycloolefin resin composition according to the present invention can be used in a wide variety of fields including the field of an electronic industry. The cycloolefin resin composition of the present invention can form a thin film excellent in the above-described properties, and is particularly suitable for use as an insulating material such as an overcoating material or inter-layer insulation material between wiring layers. As the epoxy group-containing cycloolefin resin, there may preferably be used a thermoplastic norbornene resin in which epoxy groups have been introduced by a modifying reaction.

BACKGROUND OF THE INVENTION

In recent years, insulating materials composed of a polymeric material have been used in semiconductors, IC, hybrid IC, printed circuit boards, display elements, display parts and the like as overcoats such as passivation films, solder resists, plating resists, layer insulation films and moisture-proof protective films, and the like. The polymeric materials used in these applications have come to be required to have improved properties and high reliability according to the miniaturization of electronic parts (including components and devices), the high density assembly (high integration) and speeding up of semiconductors, and the like.

For example, a passivation film is used for preventing moisture and/or impurities from infiltrating into a semiconductor element. Since a material for passivation becomes a component of the semiconductor element, it is required to be good in heat resistance, low water-absorption property, electrical insulating property, adhesion to a substrate or the like, etc. As materials for passivation, heat-resistant polymeric materials such as polyimide resins are used together with inorganic materials such as silicon dioxide. Among these polymeric materials, polymeric materials excellent in, particularly, heat resistance and flexibility are used not only as passivation materials, but also as layer insulation films for multilayer interconnection in semiconductor elements or printed circuit boards. Since a difference in level between wiring layers, which is caused by the multilayer interconnection attendant upon high integration, causes the disconnection of wiring layers such as aluminum wires, there has been demand for development of a layer insulation film formed of a polymeric material and having good level-difference covering ability (step coverage property).

The solder resist is a resist which is silk-screened so as to protect a surface pattern on a printed board and at the same time to expose only mounting holes and electrical input-output terminals for parts (including devices and components) and is used for applying a solder to the exposed areas only to fix the parts thereto. Since the solder resist remains as a permanent coating film on the printed board, it is required to be excellent in adhesion to the surface of a copper foil, suitability for screen printing, electrical insulating property, soldering heat resistance, solvent resistance and the like. Epoxy resins have heretofore been principally used as materials for solder resists.

As described above, the polymeric materials used as insulating materials are required to be excellent in heat resistance, solvent resistance, low water-absorption property (moisture resistance), electrical insulating property, adhesion, chemical resistance and the like. However, the polymeric materials used as insulating materials to date (up to the present) have not sufficiently satisfied these properties. For example, epoxy resins and polyimide resins are excellent in heat resistance but insufficient in moisture resistance. Polybutadiene resins similarly used as insulating materials are excellent in moisture resistance but insufficient in heat resistance. Besides, as polymeric materials used in applications such as solder resists and plating resists, photosensitive polymeric resists capable of conducting minute processing are demanded in addition to non-photosensitive polymeric resists on which a pattern is printed by the conventional screen printing in order to cope with the high integration density of assembly of semiconductors.

By the way, cycloolefin resins such as thermoplastic norbornene resins have heretofore been known as polymeric materials having good electrical insulating property. However, the conventional cycloolefin resins have involved shortcomings such as (i) insufficient heat resistance because they are thermoplastic resins, (ii) poor adhesion to inorganic materials such as silicon and (iii) insufficient solvent resistance, and have not had properties satisfactory for insulating materials such as layer insulation films. For example, when a cycloolefin resin insufficient in solvent resistance is used as a layer insulation film in the form of plural layers such as multilayer interconnection (wiring) structures, the lower layer insulation film is attacked by a solvent upon formation of the upper layer insulation film by a coating process.

It has heretofore been proposed to improve the heat resistance and solvent resistance of an addition copolymer of a norbornene type monomer with ethylene by using a crosslinking agent such as sulfur or an organic peroxide, or irradiating an ionizing radiation such as an electron ray (Japanese Patent Application Laid-Open No. 34924/1987). However, this process involves a shortcoming that sulfur remains, the storage stability of a formulated solution is poor, or plant and equipment investment requires an enormous cost.

OBJECTS AND SUMMARY OF THE INVENTION

It is an object of the present invention to provide a cycloolefin resin composition excellent in heat resistance, solvent resistance, low water-absorption property, electrical insulating property, adhesion, chemical resistance and the like.

Another object of the present invention is to provide a cycloolefin composition capable of forming a thin film excellent in the above-described properties and suitable for use as an insulating material such as a layer insulation film for circuit boards, semiconductor devices, or electronic components.

A further object of the present invention is to provide a cycloolefin composition excellent in the above-described properties and capable of using as a photosensitive polymeric material.

The present inventors have carried out an extensive investigation with a view toward overcoming the above described problems involved in the prior art. As a result, it has been found that the above objects can be achieved by the provision of a resin composition comprising a resin obtained by introducing epoxy groups into a cycloolefin resin typified by a thermoplastic norbornene resin, and a crosslinking agent. The present invention has been led to completion on the basis of this finding.

According to the present invention, there is thus provided a resin composition comprising an epoxy group-containing cycloolefin resin and a crosslinking agent. A thermoplastic norbornene resin may be used as a cycloolefin resin. Epoxy groups may be introduced into the resin by subjecting the cycloolefin resin to a graft reaction with an epoxy group-containing unsaturated monomer, or to an epoxidation reaction with an epoxidizing agent such as a peracid or hydroperoxide. As the crosslinking agent, there may be used a curing agent capable of exhibiting its ability by heating. A photoreactive compound may also be used as the crosslinking agent, whereby the resulting cycloolefin resin composition may be provided as a photosensitive resin composition.

DETAILED DESCRIPTION OF THE INVENTION

[Epoxy Group-containing Cycloolefin Resin]

As examples of the cycloolefin resin useful in the practice of the present invention, may be mentioned polymers of a norbornene type monomer, random addition copolymers of a norbornene type monomer with another copolymerizable monomer such as an α-olefin, and hydrogenated products of these (co)polymers. The polymerization system of the norbornene type monomer includes an addition polymerization system making use of its endocyclic double bond and a ring-opening polymerization system.

More specifically, as examples of the cycloolefin resins, may be mentioned (a) resins obtained by hydrogenating a ring-opening (co)polymer of a norbornene type monomer, (b) copolymers obtained by the addition copolymerization of a norbornene type monomer with ethylene or an α-olefin or resins obtained by hydrogenating these copolymers, (c) (co)polymers obtained by the addition (co)polymerization of a norbornene type monomer or resins obtained by hydrogenating these (co)polymers, (d) ring-opening (co)polymers of a norbornene type monomer, and (e) addition copolymers of a norbornene type monomer with an unconjugated diene and optionally a further monomer. These cycloolefin resins are thermoplastic norbornene resins. The resins (a), (b) and (c) are thermoplastic saturated norbornene resins. The resins (d) and (e) are resins having carbon-carbon double bonds in their molecules.

The epoxy group-containing cycloolefin resin useful in the practice of the present invention can be obtained by introducing epoxy groups into such a cycloolefin resin as described above by a modifying reaction. As examples of the modification reaction, may be mentioned (i) a method in which one of the thermoplastic saturated norbornene resins (a) to (c) is subjected to a graft reaction with an epoxy group-containing unsaturated monomer and (ii) a method in which an epoxidizing agent such as a peracid or hydroperoxide is reacted with one of the thermoplastic norbornene resins (d) and (e) having carbon-carbon double bonds.

The epoxy group-containing cycloolefin resin used in the present invention is a resin having epoxy groups in the interior of its molecular chain, on its side chain(s) or at its terminal(s). Its average number molecular weight (value measured by GPC analysis making use of cyclohexane as a solvent) is generally $5\times10^3$ to $200\times10^3$, preferably $8\times10^3$ to $100\times10^3$. The content of the epoxy groups in the resin is generally 0.05–5 wt. %, preferably 0.1–3 wt. % on the basis of the weight of oxygen in the epoxy groups.

The details of production processes of the epoxy group-containing olefin resins are as follows:

(i) Grafting of Epoxy Group-containing Unsaturated Monomer

A thermoplastic saturated norbornene resin is first prepared by any one of the following various processes.

(a) At least one norbornene type monomer is subjected to ring-opening (co)polymerization using, as a catalyst, a compound of titanium or tungsten in accordance with any known ring-opening polymerization process to prepare a ring-opening (co)polymer. The carbon-carbon double bonds in the ring-opening (co)polymer are then hydrogenated by the conventional hydrogenation process to produce a thermoplastic saturated norbornene resin. (b) At least one norbornene type monomer and an unsaturated monomer such as ethylene are additionally polymerized by any known process using a catalyst system composed of a transition metal compound (for example, a titanium compound)/an aluminum compound, thereby obtaining a copolymer. If necessary, the copolymer is then hydrogenated to produce a thermoplastic saturated norbornene resin. (c) At least one norbornene resin is additionally (co)polymerized by any known process using a catalyst system composed of a transition metal compound (for example, a titanium compound)/an aluminum compound or a palladium catalyst, thereby obtaining a (co)polymer. If necessary, the (co)polymer is then hydrogenated to produce a thermoplastic saturated norbornene resin. With respect to the (co)polymers (b) and (c), carbon-carbon double bonds exist in their molecules according to the kind of the norbornene type monomer used. In such a case, hydrogenation is conducted on such a polymer after the (co)polymerization to saturate the double bonds. The rate of hydrogenation in these resins is generally at least 90%, preferably at least 95%, more preferably at least 99% from the viewpoints of heat resistance and photo-deterioration resistance.

The thermoplastic saturated norbornene resin (a), (b) or (c) thus produced is subjected to a graft reaction with an epoxy group-containing unsaturated monomer to introduce epoxy groups therein. The graft reaction can be conducted by a process (solution method) in which the resin and the epoxy group-containing unsaturated monomer are reacted in a solution using a radical generating agent such as a peroxide, or a process (melting method) in which the resin, the epoxy group-containing unsaturated monomer and a radical generating agent are melted and kneaded to react them.

(ii) Direct Epoxidation (d) The ring-opening (co)polymer obtained by subjecting at least one norbornene type monomer to ring-opening (co)polymerization and (e) the addition copolymer obtained by copolymerizing at least one norbornene type monomer, an unconjugated diene and optionally a further copolymerizable unsaturated monomer have carbon-carbon double bonds in their molecules. An epoxidizing agent is caused to act on these thermoplastic norbornene resins having the double bonds, whereby epoxy groups can be introduced therein.

As the epoxidizing agent, may be mentioned peracids and hydroperoxides. Examples of the peracids include performic acid, peracetic acid, perbenzoic acid and trifluoroperacetic acid. Examples of the hydroperoxides include hydrogen peroxide, tert-butyl hydroperoxide and cumene hydroperoxide. The epoxidation reaction can be conducted by reacting the thermoplastic norbornene resin having the double bonds and the epoxidizing agent in an organic solvent in accordance with any known process.

[Cycloolefin Monomer]

As examples of the cycloolefin monomers used for preparing the cycloolefin resins, may be mentioned norbornene type monomers disclosed in Japanese Patent Application Laid-Open Nos. 14882/1991, 122137/1991, 227424/1990 and 276842/1990, etc.

As examples of the norbornene type monomers, may be mentioned norbornene, dicyclopentadiene, dimethanooctahydronaphthalene, dimethanocyclopentadienonaphthalene, the trimer and tetramer of cyclopentadiene, addition products of cyclopentadiene and tetrahydroindene or the like; alkyl-, alkylidene- or aromatic-substituted derivatives of these norbornene type compounds; derivatives of the substituted or unsubstituted norbornene type compounds substituted by a polar group such as a halogen, hydroxyl group, ester group, alkoxy group, cyano group, amide group, imide group or silyl group; etc.

More specifically, as examples of the norbornene type monomers, may be mentioned 2-norbornene, 5-methyl-2-norbornene, 5,5-dimethyl-2-norbornene, 5-ethyl-2-norbornene, 5-butyl-2-norbornene, 5-ethylidene-2-norbornene, 5-methoxycarbonyl-2-norbornene, 5-cyano-2-norbornene, 5-methyl-5-methoxycarbonyl-2-norbornene, 5-phenyl-2-norbornene, 5-phenyl-5-methyl-2-norbornene; dicyclopentadiene, 2,3-dihydrodicyclopentadiene; 6-methyl-1,4:5,8-dimethano-1,4,4a,5,6,7,8,8a-octahydronaphthalene, 6-ethyl-1,4:5,8-dimethano-1,4,4a,5,6,7,8,8a-octahydronaphthalene, 6-ethylidene-1,4:5,8-dimethano-1,4,4a,5,6,7,8,8a-octahydronaphthalene, 6-chloro-1,4:5,8-dimethano-1,4,4a,5,6,7,8,8a-octahydronaphthalene, 6-cyano-1,4:5,8-dimethano-1,4,4a,5,6,7,8,8a-octahydronaphthalene, 6-pyridyl-1,4:5,8-dimethano-1,4,4a,5,6,7,8,8a-octahydronaphthalene, 6-methoxycarbonyl-1,4:5,8-dimethano-1,4,4a,5,6,7,8,8a-octahydronaphthalene; 1,4:5,8-dimethano-1,2,3,4,4a,5,8,8a-octahydro-2,3-cyclopentadienonaphthalene, 1,4:5,10:6,9-trimethano-1,2,3,4,4a,5,5a,6,9,9a,10,10a-dodecahydro-2,3-cyclopentadienoanthracene; and 1,4-methano-1,4,4a,4b,5,8,8a,9a-octahydrofluorene and 5,8-methano-1,2,3,4,4a,5,8,8a-octahydro-2,3-cyclopentadienonaphthalene. These norbornene type monomers may be used either singly or in any combination thereof. Of these, dimethanooctahydronaphthalenes such as 6-methyl-1,4:5,8-dimethano-1,4,4a,5,6,7,8,8a-octahydronaphthalene (MTD), dicyclopentadiene (DCP), 5-ethylidene-2-norbornene (ENB) and mixtures of two or more monomers thereof are preferred.

[Unsaturated Monomer]

As examples of the unsaturated monomer copolymerizable with the norbornene type monomer, may be mentioned α-olefins such as ethylene, propylene, 1-butene, 3-methyl-1-butene, 1-pentene, 3-methyl-1-pentene, 4-methyl-1-pentene, 1-hexene, 1-octene, 1-decene, 1-dodecene, 1-tetradodecene, 1-hexadecene and 1-eicosene; alicyclic olefins such as cyclopentene, cyclohexene, 3,4-dimethylcyclopentene, 3-methylcyclohexene and 2-(2-methylbutyl)-1-cyclohexene; aromatic vinyl compounds such as styrene and α-methylstyrene; non-norbornene type alicyclic olefins such as 3a,5,6,7a-tetrahydro-4,7-methano-1H-indene; unconjugated dienes such as 1,4-hexadiene, 1,6-octadiene, 2-methyl-1,5-hexadiene, 6-methyl-1,5-heptadiene, 7-methyl-1,6-octadiene, cyclohexadiene, methyltetrahydroindene, divinylbenzene, 1,5-hexadiene and norbonadiene; and trienes such as 2-propenyl-2,5-norbonadiene, 1,3,5-octatriene and 1,4,9-decatriene.

When an addition copolymer of the norbornene type monomer/the unconjugated diene, or an addition copolymer of the norbornene type monomer/the unconjugated diene/the other unsaturated monomer is prepared, a norbornene type unconjugated diene may be used in place of the unconjugated diene mentioned above. As examples of such norbornene type unconjugated dienes, may be mentioned 5-vinylnorbornene, 5-ethylidene-2-norbornene (ENB), 5-methylene-2-norbornene, 5-isopropylidene-2-norbornene and 6-chloromethyl-5-isopropenyl-2-norbornene. Accordingly, the above described addition polymers (e) include, for example, copolymers of MTD/ENB/ethylene.

When the norbornene type monomer is copolymerized with these unsaturated monomers, the proportions of these unsaturated monomers to be used may be suitably determined according to the kinds of the unsaturated monomers and the physical properties of the resulting copolymer. For example, in the case where ethylene is used as the unsaturated monomer, the proportion of the ethylene to be used is generally 80 mol % or lower, preferably 70 mol % or lower, more preferably 60 mol % or lower. In the case where other unsaturated monomers than ethylene are copolymerized to regulate the molecular weight of the copolymer and modify the resin, these unsaturated monomers are generally used in a proportion of 30 mol % or lower, preferably 20 mol % or lower, more preferably 10 mol % or lower.

[Epoxy Group-containing Unsaturated Monomer]

Examples of the epoxy group-containing monomer include glycidyl esters such as glycidyl acrylate, glycidyl methacrylate and glycidyl p-styrylcarboxylate; mono- or polyglycidyl esters of unsaturated polycarboxylic acids such as maleic acid, itaconic acid, citraconic acid, butenetricarboxylic acid, endo-cis-bicyclo[2,2,1]hept-5-ene-2,3-dicarboxylic acid and endo-cis-bicyclo[2,2,1]hept-5-ene-2-methyl-2,3-dicarboxylic acid; unsaturated glycidyl ethers such as allyl glycidyl ether, 2-methylallyl glycidyl ether, glycidyl ether of o-allylphenol, glycidyl ether of m-allylphenol, glycidyl ether of p-allylphenol, glycidyl ether of isopropenylphenol, glycidyl ether of o-vinylphenol, glycidyl ether of m-vinylphenol and glycidyl ether of p-vinylphenol; alkylene oxide group-containing unsaturated monomers such as 2-(o-vinylphenyl)ethylene oxide, 2-(p-vinylphenyl)ethylene oxide, 2-(o-allylphenyl)ethylene oxide, 2-(p-allylphenyl)ethylene oxide, 2-(p-vinylphenyl)propylene oxide, 2-(o-allylphenyl)propylene oxide and 2-(p-allylphenyl)propylene oxide; glycidyl group-containing aromatic vinyl compounds such as p-glycidylstyrene; epoxy group-containing vinyl monomers such as 3,4-epoxy-1-butene, 3,4-epoxy-3-methyl-1-butene, 3,4-epoxy-1-pentene, 3,4-epoxy-3-methyl-1-pentene and 5,6-epoxy-1-hexene; and epoxy group-containing cyclic unsaturated monomers such as vinylcyclohexene monooxide and allyl-2,3-epoxycyclopentyl ether.

In the present invention, epoxy group-containing cycloolefin resins may be used either singly or in any combination thereof. The epoxy group-containing cycloolefin resin may also be used in combination with cycloolefin resins (thermoplastic norbornene resins) having no epoxy group. The epoxy group-containing cycloolefin resin may have functional groups such as a hydroxyl group, ester group, organic silicon group and carboxyl group. To the epoxy group-containing cycloolefin resin, if desired, may be added various kinds of additives, such as age resisters such as phenolic compounds and phosphorus compounds; heat deterioration preventives such as phenolic compounds;

ultraviolet light stabilizers such as benzophenone compounds; and antistatic agents such as amine compounds, in addition to the crosslinking agent. Further, other resins, rubber, fillers and the like may be used in combination with the epoxy group-containing cycloolefin resin within limits not impeding the objects of the present invention.
[Crosslinking Agent]

In the present invention, a crosslinking agent is incorporated into the epoxy group-containing cycloolefin resin to crosslink the resin. (I) A curing agent of the type that its ability is exhibited by heating it to room temperature or higher and (II) a photoreactive compound are typical of the crosslinking agent. A crosslinking auxiliary such as a curing auxiliary or a sensitizer may be added together with the crosslinking agent. (I) Curing Agent Capable of Exhibiting its Ability by Heating As the curing agent capable of exhibiting its ability by heating, may be mentioned aliphatic polyamines, alicyclic polyamines, aromatic polyamines, bisazides, acid anhydrides, dicarboxylic acids, polyhydric alcohols and polyamides, which are known as curing agents for epoxy resins.

Specific examples of such curing agents include aliphatic polyamines such as hexamethylenediamine, triethylenetetramine, diethylenetriamine and tetraethylenepentamine; alicyclic polyamines such as diaminocyclohexane, 3(4),8(9)-bis(aminomethyl)tricyclo[5, 2,1,0$^{2,6}$]decane, 1,3-(diaminomethyl)cyclohexane, menthenediamine, isophoronediamine, N-aminoethylpiperazine, bis(4-amino-3-methylcyclohexyl) methane and bis(4-aminocyclohexyl)methane; aromatic polyamines such as 4,4'-diaminodiphenyl ether, 4,4'-diaminodiphenylmethane, α,α'-bis(4-aminophenyl)-1,3-diisopropylbenzene, α,α'-bis(4-aminophenyl)-1,4-diisopropylbenzene, 4,4'-diaminodiphenyl sulfone and m-phenylenediamine; bisazides such as 4,4'-bisazidobenzal(4-methyl)cyclohexanone, 4,4'-diazidochalcone, 2,6-bis(4'-azidobenzal)cyclohexanone, 2,6-bis(4'-azidobenzal)-4-methylcyclohexanone, 4,4'-diazidodiphenyl sulfone, 4,4'-diazidodiphenylmethane and 2,2'-diazidostilbene; acid anhydrides such as phthalic anhydride, pyromellitic anhydride, benzophenonetetracarboxylic anhydride, nadic anhydride, 1,2-cyclohexanedicarboxylic anhydride, maleic anhydride-modified polypropylene and maleic anhydride-modified cycloolefin resins; dicarboxylic acids such as fumaric acid, phthalic acid, maleic acid, trimellitic acid and himic acid; polyhydric alcohols such as phenol novolak resins and cresol novolak resin; and polyamides such as nylon 6, nylon 66, nylon 610, nylon 11, nylon 612, nylon 12, nylon 46, methoxymethylated polyamides, polyhexamethylenediamine terephthalamide and polyhexamethylene isophthalamide. These curing agents may be used either singly or in any combination thereof. Among these curing agents, the amine curing agents such as the aliphatic polyamines, alicyclic polyamines and aromatic polyamines are preferred because they are easy to be uniformly dispersed in the resin. As needed, any curing auxiliary may be incorporated to enhance the efficiency of the crosslinking reaction.

The compounding proportion of the curing agent is generally within a range of 0.1–30 parts by weight, preferably 1–20 parts by weight per 100 parts by weight of the epoxy group-containing cycloolefin resin. If the compounding proportion of the curing agent is too low, the crosslinking reaction becomes insufficient, and so the solvent resistance and heat resistance of the cured resin are deteriorated. On the contrary, any proportion too high results in a cured resin lowered in electrical properties and moisture resistance. It is hence not preferable to use the curing agent in any proportion outside the above range.

As examples of the curing auxiliary, may be mentioned amines such as pyridine, benzylmethylamine, triethanolamine, triethylamine and imidazoles. The curing auxiliary is added in order to regulate the rate of the crosslinking reaction and enhance the efficiency of the crosslinking reaction. The compounding proportion of the curing auxiliary is generally within a range of 0.1–30 parts by weight, preferably 1–20 parts by weight per 100 parts by weight of the epoxy group-containing cycloolefin resin.

The epoxy group-containing cycloolefin resin, the curing agent and the other components optionally added are intimately mixed to prepare a resin composition. As a method of uniformly dispersing the curing agent and the like in the resin, there is a method in which the resin, the curing agent and the other components are uniformly dissolved or dispersed in a solvent capable of dissolving the resin and the solvent is then removed. As another method, there is a method in which the resin, the curing agent and the other components are melted and mixed.

The solvent for the epoxy group-containing cycloolefin resin is preferably an organic solvent inert to the resin and the curing agent and removable with ease. As examples thereof, may be mentioned toluene, xylene, ethylbenzene, trimethylbenzene, chlorobenzene, decalin and tetralin.

The solution containing the epoxy group-containing cycloolefin resin and the curing agent can be formed or molded into a film or another article by a coating process, casting process or the like. The resin composition comprising the epoxy group-containing cycloolefin resin and the curing agent may be formed or molded into a film or another article by a melt molding or forming process. Operations such as the dissolution in the solvent, removal of the solvent, melting and mixing, and melt molding or forming are performed under temperature conditions that the curing agent is not activated, or the rate of cure is sufficiently low. It is preferable to select a curing agent suitable for the individual operations.

After formed or molded into the desired form, the resin composition comprising the epoxy group-containing cycloolefin resin and the curing agent can be crosslinked by heating it to room temperature or higher. The curing temperature is generally at least room temperature, preferably 30–400° C., more preferably 100–350° C. though it varies according to the kind of the curing agent. The curing time is generally of the order of several seconds to 1 day, preferably 10 minutes to 5 hours though it varies according to the kind of the curing agent and the curing temperature.

(II) Photoreactive Substance

In the present invention, a photoreactive substance may be used as the crosslinking agent. The photoreactive substance is a substance which reacts to the epoxy group-containing cycloolefin resin by irradiation of an actinic ray such as an ultraviolet radiation such as a g ray, h ray or i ray, far ultraviolet radiation, X ray, or electron beams to form a crosslinked product. As examples of the photoreactive substance useful in the practice of the present invention, may be mentioned aromatic bisazide compounds, photo-induced amine generators and photo-induced acid generators.

Aromatic Bisazide Compound

Specific examples of the aromatic bisazide compounds include 4,4'-diazidochalcone, 2,6-bis(4'-azidobenzal)cyclohexanone, 2,6-bis(4'-azidobenzal)-4-methylcyclohexanone, 4,4'-diazidodiphenyl sulfone, 4,4'-diazidobenzophenone, 4,4'-diazidophenyl, 4,4'- bisazidostilbene, 2,2'-bisazidostilbene, 4,4'-diazido-3,3'-dimethyldiphenyl, 2,7-diazidofluorene and 4,4'-diazidophenylmethane. These compounds may be used either singly or in any combination thereof.

Photo-induced Amine Generator

The photo-induced amine generator is a compound which forms an amine upon exposure to an actinic ray. Specific examples of the photo-induced amine generators include o-nitrobenzyloxycarbonylcarbamates, 2,6-dinitrobenzyloxycarbonylcarbamates and α,α-dimethyl-3,5-dimethoxybenzyloxycarbonylcarbamates of aliphatic amines, alicyclic amines or aromatic amines. As examples of the aliphatic amines, alicyclic amines or aromatic amines used herein, may be mentioned aniline, cyclohexylamine, piperidine, hexamethylenediamine, triethylenetetramine, 1,3-(diaminomethyl)cyclohexane, 4,4'-diaminodiphenyl ether, 4,4'-diaminodiphenylmethane and phenylenediamine. These compounds may be used either singly or in any combination thereof.

Photo-induced Acid Generator

The photo-induced acid generator is a substance which forms a Brønsted acid or Lewis acid upon exposure to an actinic ray. Examples of the photo-induced acid generators include onium salts, halogenated organic compounds, quinonediazide compounds, α,αa-bis(sulfonyl) diazomethane compounds, α-carbonyl-α-sulfonyldiazomethane compounds, sulfone compounds, organic acid ester compounds, organic acid amide compounds and organic acid imide compounds.

Specific examples of the onium salts include diazonium salts, ammonium salts, iodonium salts, sulfonium salts, phosphonium salts, arsonium salts and oxonium salts, which each have an unsubstituted, or symmetrically or unsymmetrically substituted alkyl, alkenyl, aralkyl, aromatic or heterocyclic group. Examples of compounds forming counter anions to these onium salts include boric acid, arsenic acid, phosphoric acid, antimonic acid, sulfonic acid, carboxylic acids and halides thereof.

Specific examples of the halogenated organic compounds include various kinds of compounds such as halogen-containing oxadiazole compounds, halogen-containing triazine compounds, halogen-containing acetophenone compounds, halogen-containing benzophenone compounds, halogen-containing sulfoxide compounds, halogen-containing sulfone compounds, halogen-containing thiazole compounds, halogen-containing oxazole compounds, halogen-containing triazole compounds, halogen-containing 2-pyrrone compounds, halogen-containing aliphatic hydrocarbon compounds, halogen-containing aromatic hydrocarbon compounds, halogen-containing heterocyclic compounds other than those mentioned above, and sulfenyl halide compounds.

Further exemplary halogenated organic compounds include halogen-containing flame retardants such as tris(2,3-dibromopropyl)phosphate, tris(2,3-dibromo-3-chloropropyl)phosphate, chlorotetrabromobutane, hexachlorobenzene, hexabromobenzene, hexabromocyclododecane, hexabromobiphenyl, tribromophenyl allyl ether, tetrachlorobisphenol A, tetrabromobisphenol A, bis(bromoethyl ether)tetrabromobisphenol A, bis(chloroethyl ether)tetrabromobisphenol A, tris(2,3-dibromopropyl)isocyanurate, 2,2-bis(4-hydroxy-3,5-dibromophenyl)propane and 2,2-bis(4-hydroxyethoxy-3,5-dibromophenyl)propane; and organo-chloric pesticides such as dichlorodiphenyltrichloroethane, benzene hexachloride, pentachlorophenol, 2,4,6-trichlorophenyl 4-nitrophenyl ether, 2,4-dichlorophenyl 3'-methoxy-4'-nitrophenyl ether, 2,4-dichlorophenoxyacetic acid, 4,5,6,7-tetrachlorophthalide, 1,1-bis(4-chlorophenyl)ethanol, 1,1-bis(4-chlorophenyl)-2,2,2-trichloroethanol, ethyl 4,4-dichlorobenzilate, 2,4,5,4'-tetrachlorodiphenyl sulfide and 2,4,5,4'-tetrachlorodiphenyl sulfone.

Specific examples of the quinonediazide compounds include 1,2-benzoquinonediazide-4-sulfonic acid ester, 1,2-naphthoquinonediazide-4-sulfonic acid ester, 1,2-naphthoquinonediazide-5-sulfonic acid ester, 1,2-naphthoquinonediazide-6-sulfonic acid ester, 2,1-naphthoquinonediazide-4-sulfonic acid ester, 2,1-naphthoquinonediazide-5-sulfonic acid ester, 2,1-naphthoquinonediazide-6-sulfonic acid ester and sulfonic acid esters of other quinonediazide derivatives; and 1,2-benzoquinonediazide-4-sulfonic acid chloride, 1,2-naphthoquinonediazide-4-sulfonic acid chloride, 1,2-naphthoquinonediazide-5-sulfonic acid chloride, 1,2-naphthoquinonediazide-6-sulfonic acid chloride, 2,1-naphthoquinonediazide-4-sulfonic acid chloride, 2,1-naphthoquinonediazide-5-sulfonic acid chloride, 2,1-naphthoquinonediazide-6-sulfonic acid chloride and sulfonic acid chlorides of other quinonediazide derivatives.

Specific examples of the α,α-bis(sulfonyl)diazomethane compounds include α,α-bis(sulfonyl)diazomethanes each having an unsubstituted, or symmetrically or unsymmetrically substituted alkyl, alkenyl, aralkyl, aromatic or heterocyclic group.

Specific examples of the α-carbonyl-α-sulfonyldiazomethane compounds include α-carbonyl-α-sulfonyldiazomethanes each having an unsubstituted, or symmetrically or unsymmetrically substituted alkyl, alkenyl, aralkyl, aromatic or heterocyclic group.

Specific examples of the sulfone compounds include sulfone compounds and disulfone compounds each having an unsubstituted, or symmetrically or unsymmetrically substituted alkyl, alkenyl, aralkyl, aromatic or heterocyclic group.

Specific examples of the organic acid esters include carboxylic acid esters and sulfonic acid esters each having an unsubstituted, or symmetrically or unsymmetrically substituted alkyl, alkenyl, aralkyl, aromatic or heterocyclic group.

Specific examples of the organic acid amides include carboxylic acid amides and sulfonic acid amides each having an unsubstituted, or symmetrically or unsymmetrically substituted alkyl, alkenyl, aralkyl, aromatic or heterocyclic group.

Specific examples of the organic acid imides include carboxylic acid imides and sulfonic acid imides each having an unsubstituted, or symmetrically or unsymmetrically substituted alkyl, alkenyl, aralkyl, aromatic or heterocyclic group.

These compounds, which cleave upon exposure to the actinic ray to form an acid, may be used either singly or in any combination thereof.

The compounding proportion of the photoreactive substance is generally within a range of 0.1–30 parts by weight, preferably 1–20 parts by weight per 100 parts by weight of the epoxy group-containing cycloolefin resin. If the compounding proportion of the photoreactive substance is too low, the crosslinking reaction is difficult to take place, and so sufficient sensitivity and contrast cannot be achieved. On the contrary, any proportion too high results in a cured resin lowered in electrical properties and moisture resistance. It is hence not preferable to use the photoreactive substance in any proportion outside the above range. The resin composition comprising the epoxy group-containing cycloolefin resin and the photoreactive substance is a photosensitive resin composition. To the photosensitive resin composition according to the present invention, may be added a sensitizer, storage stabilizer and the like, as needed.

As examples of the sensitizer, may be mentioned carbonyl compounds such as benzophenone, anthraquinone, 1,2-naphthoquinone, 1,4-naphthoquinone, benzanthrone, p,p'-tetramethyldiaminobenzophenone and chloranil; nitro compounds such as nitrobenzene, p-dinitrobenzene and 2-nitrofluorene; aromatic hydrocarbons such as anthracene and chrysene; sulfur compounds such as diphenyl sulfide; and nitrogen compounds such as nitroaniline, 2-chloro-4-nitroaniline, 5-nitro-2-aminotoluene and tetracyanoethylene.

As examples of the storage stabilizer, may be mentioned hydroxy aromatic compounds such as hydroquinone, methoxyphenol, p-tert-butyl-catechol and 2,6-di-tert-butyl-p-cresol; quinones such as benzoquinone and p-toluquinone, amines such as phenyl-α-naphthylamine; and sulfur compounds such as 4,4'-thiobis(6-tert-butyl-3-methylphenol), 2,2'-thiobis(4-methyl-6-tert-butylphenol).

The photosensitive resin composition according to the present invention is considered to improved heat resistance owing to the fact that the photoreactive substance reacts mainly to moieties other than the epoxy groups of the epoxy group-containing cycloolefin resin, or to parts of the epoxy groups upon exposure to the actinic ray to crosslink the epoxy group-containing cycloolefin resin, and that heating further advances the crosslinking reaction including the reaction with epoxy groups. The above-described curing agent reacting to the epoxy groups by heating may be used in combination in order to assist the crosslinking reaction. When the aromatic bisazide compound is used as the photoreactive substance, a diene, triene or allyl compound may be used in combination as a crosslinking auxiliary.

In general, the photosensitive resin composition according to the present invention is uniformly dissolved in a solvent before its use. No particular limitation is imposed on the solvent to be used so far as it dissolves the resin and the photoreactive substance. As examples thereof, may be mentioned toluene, xylene, ethylbenzene, trimethylbenzene, chlorobenzene, decalin, cyclohexane, tetralin and methylcyclohexane. The proportion of the solvent to be used may be sufficient to uniformly dissolve the components such as the resin and photoreactive substance therein.

The solution of the photosensitive resin composition is coated on a substrate, dried and then optionally prebaked. The coating film thus obtained may be then cured by heating, thereby imparting excellent properties such as heat resistance and solvent resistance to the coating film. Although conditions for the cure by heating vary according to the kind of the crosslinking agent to be used, the heating temperature is generally of the order of 30–400° C., preferably 100–350° C., while the heating time is generally of the order of several seconds to 1 day, preferably 10 minutes to 5 hours.

Processing to the coating film such as perforating may be conducted before or after the cure by heating. In the case where the processing is conducted before the cure by heating, there may be used a process in which the coated surface is exposed to the actinic ray through a mask, optionally subjected to post-exposure bake and then developed, thereby forming a pattern. A solvent such as cyclohexane may be used in the development. In the case where the processing is conducted after the cure by heating, the coated surface may be exposed to an excimer laser beam or the like to directly form a pattern on the coating film.

With respect to the resin composition containing the nonphotosensitive curing agent, a desired pattern may also be formed by forming a coating film on a substrate in the same manner as described above, forming a pattern on the coating film using a general-purpose resist and then etching the coating film. The coating film on which the pattern has been formed may be cured by heating, thereby imparting excellent heat resistance, chemical resistance and the like to the coating film. Even on a coating film obtained by curing the resin composition containing the nonphotosensitive curing agent by heating, a pattern may also be directly formed on the coating film by irradiation of an excimer laser beam or the like in the same manner as described above.

The resin compositions according to the present invention permit the formation of films and coating films excellent in heat resistance, solvent resistance, low water-absorption property, electrical insulating property, adhesion, chemical resistance and the like. Therefore, they are suitable for use as insulating materials in the field of an electronic industry. The resin compositions according to the present invention can be used, for example, as overcoating materials or layer insulation materials for electronic elements such as semiconductor elements, light emitting diodes and various kinds of memory devices, hybrid IC, MCM (multi-chip-module), printed wiring (circuit) boards, display parts (including devices and components), and the like.

More specifically, the resin compositions according to the present invention are used, for example, as layer insulation films for multilayer circuit boards of electronic circuits. The layer insulation film may be in the form of one layer or plural layers. The thickness thereof is generally at most 100 μm, preferably at most 50 μm. After the solution of the resin composition according to the present invention is coated on a substrate, processing such as perforating is conducted as necessary, and cure by heating is performed to impart excellent heat resistance and solvent resistance to the coating film. Plural coating films may be formed by repeating this process.

The thin films obtained by using the resin compositions according to the present invention each generally have a water absorption of at most 0.1%, an insulation resistance of $10^{15}$–$10^{17}$ Ω/cm, and a dielectric constant of 2.3–2.6 and a dielectric loss tangent of 0.0001–0.01 as measured at a frequency of 1 MHz. Therefore, the resin compositions according to the present invention are low in water-absorption property and also dielectric constant, and excellent in electrical insulating property compared with the epoxy resins and polyimide resins heretofore used as insulating materials. On the other hand, the heat resistance of the resin compositions according to the present invention is equal to that of the conventional epoxy resins and polyimide resins. Accordingly, even when the coating film on which a pattern has been formed is brought into contact with a solder of 300° C., abnormality such as sagging (deformation), crumbling and/or blistering is not observed on the pattern. The coating films obtained by using the resin compositions according to the present invention are also good in crack resistance to various solvents and adhesion to inorganic materials such as silicon, and metals.

ADVANTAGES OF THE INVENTION

The resin compositions according to the present invention are excellent in heat resistance, solvent resistance, low water-absorption property, electrical insulating property, adhesion, chemical resistance and the like and permit the formation of thin films having the excellent properties mentioned above. The resin compositions according to the present invention are low in water-absorption property and moreover dielectric constant, and excellent in electrical insulating property compared with the epoxy resins and polyimide resins heretofore used as insulating materials.

The crosslinked coating films formed from the resin compositions according to the present invention are hard to be attacked by various solvents and chemicals and excellent in adhesion to inorganic materials such as silicon, and metals. The resin compositions of the present invention can be crosslinked under heat or given photosensitivity by selecting the crosslinking agent.

The great lowering in the water-absorption property of the resin compositions according to the present invention compared with the conventional insulating materials serves to enhance the reliability of semiconductor elements and electronic parts. In particular, the photosensitive resin composition according to the present invention can contribute to simplify the production processes of the semiconductor elements and electronic parts. A polyimide resin has heretofore been generally used as a layer insulation material. However, the polyimide resin has high heat resistance, but its dielectric constant and water absorption are generally as high as at least 3.5 and at least 1.0%, respectively. On the contrary, the dielectric constant and water absorption of the layer insulation film formed from the resin composition according to the present invention are as low as at most 2.6 and at most 0.1%, respectively. Therefore, such a film has great advantages in speeding up (operating or processing of signals) and high integration density of assembly of electronic circuits.

The resin compositions according to the present invention can be used in various field making the best use of their excellent properties, and are particularly suitable for use as insulating materials in the field of electronics.

EMBODIMENTS OF THE INVENTION

The present invention will hereinafter be described more specifically be reference to the following Referential Examples, Examples and Comparative Examples.

Referential Example 1

Fifty parts by weight of a thermoplastic norbornene resin [glass transition temperature: 152° C., rate of hydrogenation: about 100%, number average molecular weight: about 28,000 (in terms of polystyrene)] obtained by hydrogenating a ring-opening polymer of 6-methyl-1,4:5,8-dimethano-1,4, 4a,5,6,7,8, 8a-octahydronaphthalene (MTD), 10 parts by weight of allyl glycidyl ether and 5 parts by weight of 2,5-dimethyl-2,5-di(tert-butylperoxy)-hexyne-3 were mixed, and the mixture was melted and kneaded at 260° C. by means of a vented twin-screw extruder 30 mm across, thereby obtaining 51 parts by weight of an epoxy-modified thermoplastic norbornene resin (Code No. A). This resin A had a glass transition temperature of 154° C. and a number average molecular weight of about 26,000 (in terms of polystyrene). The weight content of oxygen of the epoxy groups in the resin A was 0.44% based on the polymer as measured by $^1$H-NMR.

Referential Example 2

Fifty parts by weight of the same thermoplastic norbornene resin as that used in Referential Example 1, 6 parts by weight of 5,6-epoxy-1-hexene and 1.5 parts by weight of dicumyl peroxide were dissolved in 120 parts by weight of cyclohexane to conduct reaction at 150° C. for 3 hours in an autoclave. A solution of the resulting reaction product was poured into 240 parts by weight of isopropyl alcohol to solidify the reaction product. The reaction product thus solidified was dried under reduced pressure at 100° C. for 5 hours, thereby obtaining 50 parts by weight of an epoxy-modified thermoplastic norbornene resin (Code No. B). This resin B had a glass transition temperature of 154° C. and a number average molecular weight of about 27,000 (in terms of polystyrene). The weight content of oxygen of the epoxy groups in the resin B was 0.63% based on the polymer.

Referential Example 3

Fifty parts by weight of a random addition copolymer [ethylene content: 50 mol %, glass transition temperature: 141° C., number average molecular weight: about 30,000 (in terms of polystyrene)] of ethylene and MTD, 10 parts by weight of allyl glycidyl ether and 5 parts by weight of 2,5-dimethyl-2,5-di(tert-butylperoxy)-hexyne-3 were mixed, and the mixture was melted and kneaded at 260° C. by means of the vented twin-screw extruder 30 mm across, thereby obtaining 51 parts by weight of an epoxy-modified thermoplastic norbornene resin (Code No. C). This resin C had a glass transition temperature of 140° C. and a number average molecular weight of about 28,000 (in terms of polystyrene). The weight content of oxygen of the epoxy groups in the resin C was 0.40% based on the polymer.

Referential Example 4

Fifty parts by weight of a thermoplastic norbornene resin [glass transition temperature: 133° C., rate of hydrogenation: about 100%, number average molecular weight: about 27,000 (in terms of polystyrene)] obtained by hydrogenating a ring-opening polymer of a monomer mixture of MTD and dicyclopentadiene (DCP) (molar ratio of MTD/DCP=70/30), 6 parts by weight of 5,6-epoxy-1-hexene and 1.5 parts by weight of dicumyl peroxide were dissolved in 120 parts by weight of cyclohexane to conduct reaction at 150° C. for 3 hours in an autoclave. A solution of the resulting reaction product was poured into 240 parts by weight of isopropyl alcohol to solidify the reaction product. The reaction product thus solidified was dried under reduced pressure at 100° C. for 5 hours, thereby obtaining 50 parts by weight of an epoxy-modified thermoplastic norbornene resin (Code No. D). This resin D had a glass transition temperature of 135° C. and a number average molecular weight of about 26,000 (in terms of polystyrene). The weight content of oxygen of the epoxy groups in the resin D was 0.75% based on the polymer.

Referential Example 5

Ten parts by weight of a thermoplastic norbornene resin [glass transition temperature: 140° C., number average molecular weight: about 30,000 (in terms of polystyrene)] obtained by subjecting MTD, ethylene and 5-ethylidene-2-norbornene (ENB) (molar ratio of MTD/ethylene/ENB=45/50/5) to random copolymerization were dissolved in 100 parts by weight of chloroform. One part by weight of a 30% solution of peracetic acid was poured into the resulting solution to conduct reaction at 40° C. for 3 hours. After completion of the reaction, 100 parts by weight of purified water were poured into the liquid reaction mixture to stir the resultant mixture at 30° C. for 10 minutes. Thereafter, the mixture was left to stand for 20 minutes at 30° C. Since this liquid reaction mixture separated into two liquid layers, the lower chloroform layer was taken out. This chloroform solution was poured into 500 parts by weight of isopropanol to solidify the resulting reaction product. The reaction product thus solidified was dried under reduced pressure at 100° C. for 5 hours, thereby obtaining an epoxy-modified thermoplastic norbornene resin (Code No. E). This resin E had a glass transition temperature of 140° C. and a number average molecular weight of about 30,000 (in terms of polystyrene). The weight content of oxygen of the epoxy groups in the Resin E was 0.42% based on the polymer.

EXAMPLE 1

Thirty parts by weight of the epoxy-modified thermoplastic resin A obtained in Referential Example 1 and 1.2 parts by weight of 4,4'-bisazidobenzal(4-methyl)-cyclohexanone were dissolved in 100 parts by weight of xylene. As a result, a uniform solution was obtained without producing any precipitate.

<Measurement of Water Absorption>

A film was formed from this solution by a casting process and then dried, thereby obtaining a film 10μ thick. This film was subjected to a heat treatment (cure) at 250° C. for 3 hours under nitrogen. This film had a water absorption of 0.02%. The water absorption was determined in accordance with JIS K 6911 by immersing a specimen for 24 hours and then calculating the percentage of an increased mass to a mass of the specimen before the immersion in water.

<Overcoat Formation (1)>

After the solution prepared above was coated on a silicon wafer, in which an aluminum wiring had been formed on an $SiO_2$ film 4000 Å thick, by a spin coating process, the thus-coated solution was prebaked at 90° C. for 60 seconds, thereby forming a coating film 3.3 μm thick on the aluminum wiring. The silicon wafer, on which the coating film had been formed, was subjected to cure by heating at 250° C. for 3 hours under nitrogen, thereby forming an overcoat 3 μm thick.

<Determination of Adhesion>

The adhesion of the overcoat to aluminum and $SiO_2$ was determined by a cross-cut adhesion test. As a result, the adhesion was good as demonstrated by 100/100. The cross-cut adhesion test was conducted in the following manner. Each 11 grooves were cut lengthwise and breadthwise at intervals of 1 mm through the coating film by a cutter, thereby forming a grid pattern consisting of 100 squares of 1 $mm^2$. A cellophane adhesive tape was applied over the cross-hatched areas and peeled off in a direction of 90 degrees. The number of the remaining squares among the 100 squares in the grid was counted.

<Test of Solvent Resistance/Chemical Resistance>

Acetone, isopropanol, xylene, N,N-dimethylformamide, 50% aqueous NaOH and 10% hydrochloric acid were separately dropped on portions of the above-described overcoat. The overcoat was left to stand for 10 minutes, and the respective solvents and chemicals were then removed from the overcoat to observe the surface of the overcoat. As a result, none of changes such as dissolution, cracking and swell were observed on the overcoat as to all the solvents and chemicals. Therefore, the overcoat was shown to have good solvent resistance and chemical resistance.

<Test of Soldering Heat Resistance>

The above-described overcoat was brought into contact with a solder of 300° C. for 1 minute. As a result, abnormality in appearance such as blistering was not observed on the overcoat.

<Durability Test>

The silicon wafer, on which the above-described overcoat had been formed, was left to stand for 1000 hours under conditions of 90° C. and 95% RH. As a result, none of abnormality in appearance such as blistering, the corrosion and tarnish of aluminum, and the like were observed.

<Overcoat Formation (2)>

The solution prepared above was coated on a silicon wafer, in which a copper wiring had been formed on a polyimide film 10 μm thick, by a spin coating process, and prebaked at 90° C. for 60 seconds, thereby forming a coating film 3.3 μm thick on the copper wiring. The silicon wafer, on which the coating film had been formed, was subjected to cure by heating at 250° C. for 3 hours under nitrogen, thereby forming an overcoat 3 μm thick.

The adhesion of the overcoat thus formed to the copper wiring and the polyimide film was determined by the cross-cut adhesion test. As a result, the adhesion was good as demonstrated by 100/100. This wafer was left to stand for 1000 hours under conditions of 90° C. and 95% RH. As a result, none of abnormality in appearance such as blistering, the corrosion and tarnish of copper, and the like were observed.

EXAMPLES 2–7

The combinations and compounding proportions of the epoxy-modified thermoplastic norbornene resin and curing agent were changed as shown in Table 1 to conduct the same treatment as in Example 1. The results are shown in Table 1. With respect to "Adhesion" and "Corrosion/tarnish of aluminum/copper", two kinds of wafers, on which an overcoat was formed, were prepared in the same manner as in Example 1 to conduct the tests of the adhesion and durability for these wafers, thereby synthetically evaluate them.

TABLE 1

| Ex. | Resin code (parts by weight) | Crosslinking agent (parts by weight) | Water absorption (%) | Adhesion | Solvent resistance/ chemical resistance | Soldering heat resistance | Corrosion/tarnish of aluminum/ copper |
|---|---|---|---|---|---|---|---|
| 1 | A (30) | 4,4'-Bisazidobenzal-(4-methyl)cyclohexanone (1.2) | 0.02 | Good | Good | Good | Not occurred |
| 2 | A (30) | 3(4),8(9)-Bis(amino-methyl)tricyclo[5,2,1,$O^{2,6}$]decane. (0.8) | 0.01 | Good | Good | Good | Not occurred |
| 3 | A (30) | α,α'-Bis(4-aminophenyl)-1,3-diisopropylbenzene (1.5) | 0.02 | Good | Good | Good | Not occurred |
| 4 | B (30) | α,α'-Bis(4-aminophenyl)-1,3-diisopropylbenzene (2.0) | 0.04 | Good | Good | Good | Not occurred |

TABLE 1-continued

| Ex. | Resin code (parts by weight) | Crosslinking agent (parts by weight) | Water absorption (%) | Adhesion | Solvent resistance/ chemical resistance | Soldering heat resistance | Corrosion/tarnish of aluminum/ copper |
|---|---|---|---|---|---|---|---|
| 5 | C (30) | α,α'-Bix(4-aminophenyl)-1,3-diisoproplybenzene (1.3) | 0.02 | Good | Good | Good | Not occurred |
| 6 | D (30) | 2,6-Bis(4'-azidobenzal)-4-methylcyclohexanone (2.5) | 0.05 | Good | Good | Good | Not occurred |
| 7 | E (30) | α,α'-Bis(4-aminophenyl)-1,3-diisopropylbenzene (1.4) | 0.02 | Good | Good | Good | Not occurred |

EXAMPLE 8

After 30 parts by weight of the epoxy-modified thermoplastic norbornene resin A obtained in Referential Example 1 and 1.5 parts by weight of 2,6-bis(4'-azido-benzal)-4-methylcyclohexanone were dissolved in 70 parts by weight of xylene, the resulting solution was filtered through a Millipore filter having a pore size of 0.22 μm, thereby preparing a solution of a photosensitive resin composition. This solution was coated on a silicon wafer by means of a spin coater and then prebaked at 80° C. for 90 seconds to form a coating film 15 μm thick. This coating film was exposed for 30 seconds to ultraviolet light having a light intensity of 5 mW/cm$^2$ at 365 nm using a test pattern mask for forming via holes and then developed with cyclohexane to form via holes 15–50 μm across. The coating film thus developed was then cured by heating at 250° C. for 3 hours under nitrogen in an oven.

After copper plating (electroless and/or electro plating) was then applied over the surface of the coating film to form a copper layer 5 μm thick, a resist was applied thereon. The resist was exposed by means of a mask for a wiring pattern and then developed. The thus-treated silicon wafer was immersed in an aqueous solution of ammonium persulfate to etch the copper layer. The resist was then peeled off to form a copper wiring. In these processes, the adhesion of the coating film to the silicon wafer and copper was good.

On the coating film on which the copper wiring had been formed, was coated again the same solution of the photosensitive resin composition as that used previously. The same procedure as described above was repeated to fabricate a circuit board model having two insulating layers and two wiring layers. In the fabrication of this circuit board model, no occurrence of cracking caused by the solvent was observed (solvent resistance was good). Therefore, even when the solution of the photosensitive resin composition was coated one over another, no problem of the occurrence of cracking arises on the lower coating layer. In the resulting circuit board, abnormality such as peeling of the copper wiring or blistering was not observed when the insulating film was brought into contact with a solder of 300° C. for 1 minute (soldering heat resistance was good).

A crosslinked film was formed using the solution of the photosensitive resin composition to measure its water absorption and electrical properties (dielectric constant, dielectric loss tangent, insulation resistance) in accordance with JIS K 6911. The results are shown in Table 2.

EXAMPLES 9–15

The combinations and compounding proportions of the epoxy-modified thermoplastic norbornene resin and photoreactive substance were changed as shown in Table 2 to conduct the same treatment as in Example 8. The results are shown in Table 2.

TABLE 2

| Ex. | Resin code (parts by weight) | Crosslinking agent (parts by weight) | Water absorption (%) | Adhesion | Solvent resistance | Soldering heat resistance | Dielectric constant | Dielectric loss tangent | Insulation resistance (Ω/cm) |
|---|---|---|---|---|---|---|---|---|---|
| 8 | A (30) | 2,6-Bis(4'-azidobenzal)-4-methylcyclohexanone (1.5) | 0.02 | Good | Good | Good | 2.3 | 0.0008 | $5 \times 10^{16}$ |
| 9 | A (30) | 4,4'-Bisazidostilbene (1.1) | 0.01 | Good | Good | Good | 2.3 | 0.0008 | $5 \times 10^{16}$ |
| 10 | A (30) | Bisphenol A di-p-toluenesulfonate (0.4) | 0.02 | Good | Good | Good | 2.3 | 0.0009 | $4 \times 10^{16}$ |
| 11 | A (30) | Bis(2-nitrobenzyloxy-carbonyl)hexane-1,6-diamine (1.8) | 0.04 | Good | Good | Good | 2.4 | 0.001 | $2 \times 10^{16}$ |
| 12 | B (30) | 2,6-Bis(4'-azidobenzal)-4-methylcyclohexanone (2.1) | 0.04 | Good | Good | Good | 2.4 | 0.002 | $2 \times 10^{16}$ |
| 13 | C (30) | 2,6-Bis(4'-azidobenzal)-4-methylcyclohexanone (1.3) | 0.02 | Good | Good | Good | 2.3 | 0.0008 | $5 \times 10^{16}$ |

TABLE 2-continued

| Ex. | Resin code (parts by weight) | Crosslinking agent (parts by weight) | Water absorption (%) | Adhesion | Solvent resistance | Soldering heat resistance | Dielectric constant | Dielectric loss tangent | Insulation resistance ($\Omega$/cm) |
|---|---|---|---|---|---|---|---|---|---|
| 14 | D (30) | 2,6-Bis(4'-azidobenzal)-4-methylcyclohexanone (2.5) | 0.05 | Good | Good | Good | 2.5 | 0.002 | $1 \times 10^{16}$ |
| 15 | E (30) | 2,6-Bis(4'-azidobenzal)-4-methylcyclohexanone (1.5) | 0.02 | Good | Good | Good | 2.3 | 0.0008 | $5 \times 10^{16}$ |

EXAMPLE 16

After 30 parts by weight of the epoxy-modified thermoplastic norbornene resin A obtained in Referential Example 1 and 1.5 parts by weight of α,α'-bis(4-aminophenyl-1,3-diisopropylbenzene were dissolved in 70 parts by weight of xylene, the resulting solution was filtered through a Millipore filter having a pore size of 0.22 $\mu$m, thereby preparing a solution of a photosensitive resin composition. This solution was coated on a silicon wafer by means of a spin coater and then prebaked at 80° C. for 90 seconds to form a coating film 15 $\mu$m thick. The silicon wafer, on which the coating film had been formed, was cured by heating at 250° C. for 3 hours under nitrogen in an oven. The thus-cured coating film was exposed to an excimer laser beam through a mask to form via holes. After copper plating was then applied over the surface of the coating film to form a copper layer 5 $\mu$m thick, a resist was applied thereon. The resist was exposed by means of a mask for a wiring pattern and then developed. The thus-treated silicon wafer was immersed in an aqueous solution of ammonium persulfate to etch the copper layer. The resist was then peeled off to form a copper wiring. In these processes, the adhesion of the coating film to the silicon wafer and copper was good.

On the coating film on which the copper wiring had been formed, was coated again the same solution of the photosensitive resin composition as that used previously. The same procedure as described above was repeated to fabricate a circuit board model having two insulating layers and two wiring layers. In the fabrication of this circuit board model, no occurrence of cracking caused by the solvent was observed (solvent resistance was good). Therefore, even when the solution of the photosensitive resin composition was coated one over another, no problem of the occurrence of cracking arises on the lower coating layer. In the resulting circuit board, abnormality such as peeling of the copper wiring or blistering was not observed when the insulating film was brought into contact with a solder of 300° C. for 1 minute (soldering heat resistance was good).

A crosslinked film was formed using the solution of the photosensitive resin composition to measure its water absorption and electrical properties (dielectric constant, dielectric loss tangent, insulation resistance) in accordance with JIS K 6911. The results are shown in Table 3.

EXAMPLES 17–21

The combinations and compounding proportions of the epoxy-modified thermoplastic norbornene resin and photoreactive substance were changed as shown in Table 3 to conduct the same treatment as in Example 16. The results are shown in Table 3.

TABLE 3

| Ex. | Resin code (parts by weight) | Crosslinking agent (parts by weight) | Water absorption (%) | Adhesion | Solvent resistance | Soldering heat resistance | Dielectric constant | Dielectric loss tangent | Insulation resistance ($\Omega$/cm) |
|---|---|---|---|---|---|---|---|---|---|
| 16 | A (30) | α,α'-Bis(4-aminophenyl)-1,3-diisopropylbenzene (1.5) | 0.02 | Good | Good | Good | 2.3 | 0.0008 | $5 \times 10^{16}$ |
| 17 | A (30) | 3(4),8(9)-Bis(aminomethyl)tricyclo[5,6,1,$O^{2,6}$]decane (0.8) | 0.01 | Good | Good | Good | 2.3 | 0.0008 | $6 \times 10^{16}$ |
| 18 | B (30) | α,α'-Bis(4-aminophenyl)-1,3-diisopropylbenzene (2.0) | 0.04 | Good | Good | Good | 2.4 | 0.0015 | $2 \times 10^{16}$ |
| 19 | C (30) | α,α'-Bis)4-aminophenyl)-1,3-diisopropylbenzene (1.3) | 0.02 | Good | Good | Good | 2.3 | 0.0008 | $5 \times 10^{16}$ |
| 20 | D (30) | α,α'-Bis(4-aminopheyl)-1,3-diisopropylbenzene (2.4) | 0.04 | Good | Good | Good | 2.4 | 0.002 | $2 \times 10^{16}$ |
| 21 | E (30) | α,α'-Bis(4-aminophenyl)-1,3-diisopropylbenzene (1.4) | 0.02 | Good | Good | Good | 2.3 | 0.0008 | $5 \times 10^{16}$ |

Comparative Example 1

An experiment was conducted in the same manner as in Example 8 except that the crosslinking agent was not incorporated into the epoxy-modified thermoplastic norbornene resin A obtained in Referential Example 1. As a result, the central part of the lower coating film was dissolved upon the application of the second layer and became hollow. When the coating film was brought into contact with a solder of 300° C. for 1 minute, the contacted part was melted and deformed.

Comparative Example 2

After 30 parts by weight of a thermoplastic norbornene resin [glass transition temperature: 152° C., rate of hydrogenation: about 100%, number average molecular weight: about 28,000 (in terms of polystyrene)] obtained by hydrogenating a ring-opening polymer of MTD and 1.5 parts by weight of 2,6-bis(4'-azidobenzal)-4-methylcyclohexanone were dissolved in 100 parts by weight of xylene, the resulting solution was filtered through a Millipore filter having a pore size of 0.22 μm, thereby preparing a solution of a photosensitive resin composition. This solution was used to conduct an experiment in the same manner as in Example 8. As a result, the insulating layers were partly peeled off after the curing by heating. In addition, the lower coating layer was cracking upon the etching of the copper layer.

EXAMPLE 22

After 30 parts by weight of the epoxy-modified thermoplastic norbornene resin A and 1.5 parts by weight of 2,6-bis(4'-azidobenzal)-4-methylcyclohexanone were dissolved in 100 parts by weight of xylene, the resulting solution was filtered through a Millipore filter having a pore size of 0.22 μm, thereby preparing a solution of a photosensitive resin composition. This solution was coated on a silicon wafer by means of a spin coater and then prebaked at 80° C. for 90 seconds to form a coating film 5 μm thick. This coating film was exposed for 30 seconds to ultraviolet light having a light intensity of 5 mW/cm² at 365 nm using a test pattern manufactured by TOPPAN PRINTING CO., LTD. and then developed with cyclohexane. As a result, a pattern having a line width of 5 μm was able to be resolved. The coating film thus developed was then cured by heating at 250° C. for 3 hours under nitrogen in an oven.

The silicon wafer, on which the pattern had been formed, was heated at 300° C. for 1 hour under nitrogen in an oven. As a result, neither sagging nor loss in film was observed.

In the same manner as described above, the adhesion to the substrate (cross-cut adhesion test: 100/100, good), water absorption and dielectric constant were measured. The results are shown in Table 4.

EXAMPLES 23–27

The combinations and compounding proportions of the epoxy-modified thermoplastic norbornene resin and photoreactive substance were changed as shown in Table 4 to conduct the same treatment as in Example 22. The results are shown in Table 4.

TABLE 4

| Ex. | Resin code (parts by weight) | Crosslinking aqent (parts by weight) | Water absorption (%) | Adhesion | Dielectric constant | Resolution (μm) | Heat resistance (300° C. × 1 hr) |
| --- | --- | --- | --- | --- | --- | --- | --- |
| 22 | A (30) | 2,6-Bis(4'-azidobenzal)-4-methylcyclohexanone (1.5) | 0.02 | Good | 2.3 | 5 | Neither sagging of pattern nor loss in film occurred |
| 23 | A (30) | 4,4'-Bisazidostilbene (1.1) | 0.02 | Good | 2.3 | 5 | Neither sagging of pattern nor loss in film occurred |
| 24 | B (30) | 2,6-Bis(4'-azidobenzal)-4-methylcyclohexanone (1.5) | 0.02 | Good | 2.3 | 5 | Neither sagging of pattern nor loss in film occurred |
| 25 | C (30) | 2,6-Bis(4'-azidobenzal)-4-methylcyclohexanone (1.5) | 0.02 | Good | 2.3 | 5 | Neither sagging of pattern nor loss in film occurred |
| 26 | D (30) | 2,6-Bis(4'-azidobenzal)-4-methylcyclohexanone (1.5) | 0.03 | Good | 2.4 | 5 | Neither sagging of pattern nor loss in film occurred |
| 27 | E (30) | 2,6-Bis(4'-azidobenzal)-4-methylcyclohexanone (1.4) | 0.03 | Good | 2.4 | 5 | Neither sagging of pattern nor loss in film occurred |

EXAMPLE 28

After 30 parts by weight of the epoxy-modified thermoplastic norbornene resin A and 0.3 part by weight of α,α'-dibromo-p-xylene were dissolved in 100 parts by weight of xylene, the resulting solution was filtered through a Millipore filter having a pore size of 0.22 μm, thereby preparing a solution of a photosensitive resin composition. This solution was coated on a silicon wafer by means of a spin coater and then prebaked at 80° C. for 90 seconds to form a coating film 5 μm thick. This coating film was exposed for 30 seconds to ultraviolet light having a light intensity of 5 mW/cm² at 365 nm using a test pattern manufactured by TOPPAN PRINTING CO., LTD. and then developed with cyclohexane. As a result, a pattern having a line width of 6 μm was able to be resolved. The coating film thus developed was then cured by heating at 250° C. for 3 hours under nitrogen in an oven.

The silicon wafer, on which the pattern had been formed, was heated at 300° C. for 1 hour under nitrogen in an oven. As a result, neither sagging nor loss in film was observed.

In the same manner as described above, the adhesion to the substrate (cross-cut adhesion test: 100/100, good), water absorption and dielectric constant were measured. The results are shown in Table 5.

EXAMPLES 29–30

The combinations and compounding proportions of the epoxy-modified thermoplastic norbornene resin and photoreactive substance were changed as shown in Table 5 to conduct the same treatment as in Example 28. The results are shown in Table 5.

TABLE 5

| Ex. | Resin code (parts by weight) | Crosslinking agent (parts by weight) | Water absorption (%) | Adhesion | Dielectric constant | Resolution (µm) | Heat resistance (300° C. + 1 hr) |
|---|---|---|---|---|---|---|---|
| 28 | A (30) | α,α'-Dibromo-p-xylene (0.3) | 0.02 | Good | 2.3 | 6 | Neither sagging of pattern nor loss in film occurred |
| 29 | A (30) | Bisphenol A di-p-toluenesulfonate (0.4) | 0.03 | Good | 2.4 | 6 | Neither sagging of pattern nor loss in film occurred |
| 30 | B (30) | Bis(2-nitrobenzyloxy-carbonyl)hexane-1,6-diamine (2.0) | 0.02 | Good | 2.4 | 6 | Neither sagging of pattern nor loss in film occurred |

Comparative Example 3

After 30 parts by weight of a ring-opening polymer [glass transition temperature: 160° C., number average molecular weight: about 21,000 (in terms of polystyrene)] of MTD and 1.5 parts by weight of 2,6-bis(4'-azidobenzal)-4-methylcyclohexanone were dissolved in 80 parts by weight of xylene, the resulting solution was filtered through a Millipore filter having a pore size of 0.22 µm, thereby preparing a solution of a photosensitive resin composition. This solution was coated on a silicon wafer by means of a spin coater and then prebaked at 80° C. for 90 seconds to form a coating film 5 µm thick. This coating film was exposed for 30 seconds to ultraviolet light having a light intensity of 5 mW/cm$^2$ at 365 nm using a test pattern manufactured by TOPPAN PRINTING CO., LTD. and then developed with cyclohexane. As a result, a pattern having a line width of 5 µm was able to be resolved. The coating film thus developed was then cured by heating at 250° C. for 3 hours under nitrogen in an oven.

The silicon wafer, on which the pattern had been formed, was heated at 300° C. for 1 hour under nitrogen in an oven. As a result, loss in film was observed.

Comparative Example 4

After 30 parts by weight of a thermoplastic norbornene resin [glass transition temperature: 152° C., rate of hydrogenation: about 100%, number average molecular weight: about 28,000 (in terms of polystyrene)] obtained by hydrogenating a ring-opening polymer of MTD and 1.5 parts by weight of 2,6-bis(4'-azidobenzal)-4-methylcyclohexanone were dissolved in 100 parts by weight of xylene, the resulting solution was filtered through a Millipore filter having a pore size of 0.22 µm, thereby preparing a solution of a photosensitive resin composition. This solution was coated on a silicon wafer by means of a spin coater and then prebaked at 80° C. for 90 seconds to form a coating film 5 µm thick. This coating film was exposed for 30 seconds to ultraviolet light having a light intensity of 5 mW/cm$^2$ at 365 nm using a test pattern manufactured by TOPPAN PRINTING CO., LTD. and then developed with cyclohexane. As a result, a pattern having a line width of 5 µm was able to be resolved. The coating film thus developed was then cured by heating at 250° C. for 3 hours under nitrogen in an oven.

The silicon wafer, on which the pattern had been formed, was heated at 300° C. for 1 hour under nitrogen in an oven. As a result, the pattern became sagged.

We claim:

1. An insulation material prepared from a resin composition comprising a) 100 parts by weight of an epoxy group-containing thermoplastic norbornene resin obtained by subjecting a thermoplastic norbornene resin to a graft reaction with an epoxy group-containing unsaturated monomer, wherein the thermoplastic norbornene resin is a hydrogenated product of a ring-opening (co)polymer obtained by the ring-opening (co)polymerization of at least one norbornene monomer, and b) from 0.31–30 parts by weight of a cross-linking agent composed of a photoreactive substance.

2. An insulation material according to claim 1, which is an insulating material for forming a crosslinked insulation film on a substrate.

3. An electronic part comprising, as an insulating film formed on a substrate, at least one crosslinked coating film composed of the resin composition according to claim 1.

4. An electronic part comprising, as an insulating film formed on a substrate, at least one crosslinked coating film composed of the resin composition according to claim 2.

* * * * *